United States Patent
Su et al.

(10) Patent No.: US 7,622,806 B2
(45) Date of Patent: Nov. 24, 2009

(54) LASER MARK ON AN IC COMPONENT

(75) Inventors: Shu-Ling Su, Tainan (TW); A-Tsung Cheng, Tainan (TW)

(73) Assignees: Chipmos Technologies (Bermuda) Ltd., Hamilton (BM); Chipmos Technologies Inc., Hsinchu (TW)

( * ) Notice: Subject to any disclaimer, the term of this patent is extended or adjusted under 35 U.S.C. 154(b) by 817 days.

(21) Appl. No.: 11/249,465

(22) Filed: Oct. 14, 2005

(65) Prior Publication Data

US 2007/0084836 A1    Apr. 19, 2007

(51) Int. Cl.
*H01L 23/48* (2006.01)

(52) U.S. Cl. .................................. 257/739; 428/195.1

(58) Field of Classification Search ................ 257/739, 257/798, 730; 428/195.1, 163
See application file for complete search history.

(56) References Cited

U.S. PATENT DOCUMENTS

| | | | | |
|---|---|---|---|---|
| 4,879,148 A | * | 11/1989 | Neaves et al. | 428/41.8 |
| 5,322,436 A | * | 6/1994 | Horng et al. | 433/23 |
| 5,644,102 A | * | 7/1997 | Rostoker | 174/547 |
| 5,821,497 A | | 10/1998 | Yamazaki et al. | |
| 5,824,393 A | * | 10/1998 | Nakamura | 428/195.1 |
| 6,872,465 B2 | * | 3/2005 | Soga et al. | 428/570 |
| 6,939,501 B2 | | 9/2005 | Grigg et al. | |
| 6,979,910 B2 | * | 12/2005 | Shirasaka | 257/797 |
| 7,487,738 B2 | * | 2/2009 | Hayashi | 116/208 |

FOREIGN PATENT DOCUMENTS

| | | |
|---|---|---|
| CN | 1458604 A | 11/2003 |
| JP | 2004255751 | 9/2004 |
| TW | 395041 | 6/2000 |
| TW | 395041 B | 6/2000 |
| TW | 516303 B | 1/2003 |

OTHER PUBLICATIONS

Abstract of TW516303B, Jan. 1, 2003.
Abstract of TW395041B, Jun. 21, 2000.
Abstract of JP2004255751, Sep. 16, 2004.
Abstract of CN1458604A, Nov. 26, 2003.

* cited by examiner

*Primary Examiner*—Cathy Lam

(57) ABSTRACT

A laser mark is inscribed on an IC component, which character stroke consists of a plurality of laser paths inscribed by a laser beam. The width of the character stroke is greater than the widths of the laser paths. In addition, at least two of the laser paths, moving in opposite directions or in a same direction of the laser beam, are integrally connected as a laser-inscribing stroke to reduce end-to-end breaks between the laser paths.

11 Claims, 3 Drawing Sheets

LASER MARK ON AN IC COMPONENT

FIELD OF THE INVENTION

The present invention relates to a laser marking technology for IC devices, and more particularly to an IC component having a laser mark without apparent end-to-end breaks.

BACKGROUND OF THE INVENTION

Laser marks are inscribed on IC components such as Arabic numerals, English letters, symbols, and trademarks to easily distinguish the device types, lot numbers, fabricator and fabricated locations of IC components. A chip with laser mark is revealed in R.O.C. Taiwan patent publication No. 395,041. A plurality of transistors are fabricated on the primary surface of the chip, and a laser marks is formed on the second surface of the chip to identify the chip.

Generally, laser marks are inscribed by a laser beam with a small beam diameter. The beam diameter of a laser beam is quite smaller than the stroke width of the laser mark. Therefore, multiple laser paths in parallel are gathered as a character stroke for recognition.

As shown in FIG. 1, a conventional laser mark 100 in an IC component comprises a plurality of characters 110 which may be upper or lower case English characters or Arabic numbers. Each character 110 has at least a character stroke, the character stroke width 111 much greater than the width of a laser path 120 by a laser beam. As a result, a laser beam needs to repeatedly open and close from one end of the character stroke to another end of the character stroke to form a plurality of laser paths 120 in parallel as a character stroke. Each laser path 120 is individually created by inscribing of a laser beam to have two endpoints 121,122. Because the endpoints 121 or 122 of the laser paths 120 in a same character stroke are adjacent, end-to-end breaks apparently look like a defect (as shown in upper photograph in FIG. 3). When the character 110 is an Unclosed character such as "C", "h", "M", "S", . . . etc., the first endpoints 121 and the second endpoints 122 of the laser paths 120 are numerous and respectively located at two ends of the character stroke leading to discontinuity and broken lines of an character 110. When the character 110 is a closed character such as "O", "0", all of the first endpoints 121 and the second endpoints 122 of the laser paths 120 in the closed character are close together to from an obvious gap. The gap should be kept, otherwise overlapping will lead to over-inscribing and causes melting and diffusion on the back surface of an IC component. Therefore, lots of endpoints 121 and 122 of the laser paths 120 are separate and adjacent causing discontinuity and broken lines between the laser paths 120.

SUMMARY OF THE INVENTION

The main purpose of the present invention is to provide an IC component having a laser mark. Within a character stroke, at least two of a plurality of laser paths are integrally connected as a laser-inscribing stroke with a U-shaped connection or a curve to reduce end-to-end breaks between the laser paths.

According to the present invention, a laser mark is fabricated in an IC component, includes at least a character. A plurality of laser paths inscribed in a surface of the IC component by laser beam to constitute a character stroke of the character, wherein the width of the character stroke is greater than the widths of the laser paths, wherein at least two of the plurality of laser paths are integrally connected as a laser-inscribing stroke to reduce end-to-end breaks between the laser paths.

DETAIL DESCRIPTION OF THE INVENTION

Please refer to the attached drawings, the present invention will be described by means of an embodiment below.

Figure 1:
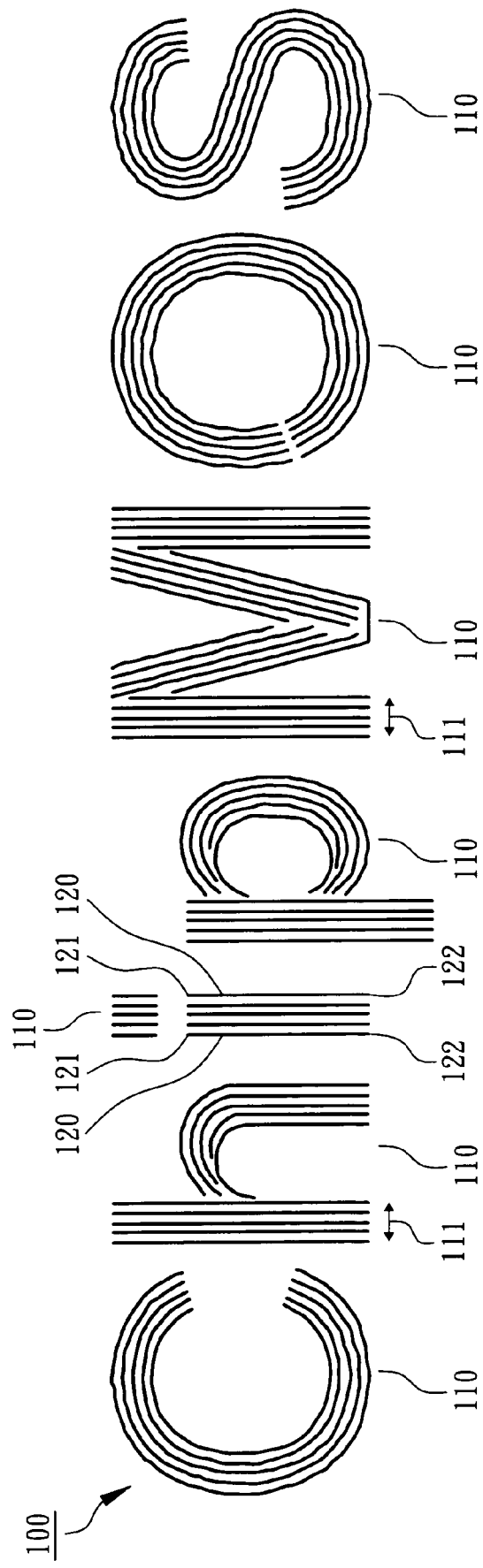
FIG. 1 shows a conventional laser mark on an IC component.
Figure 2:
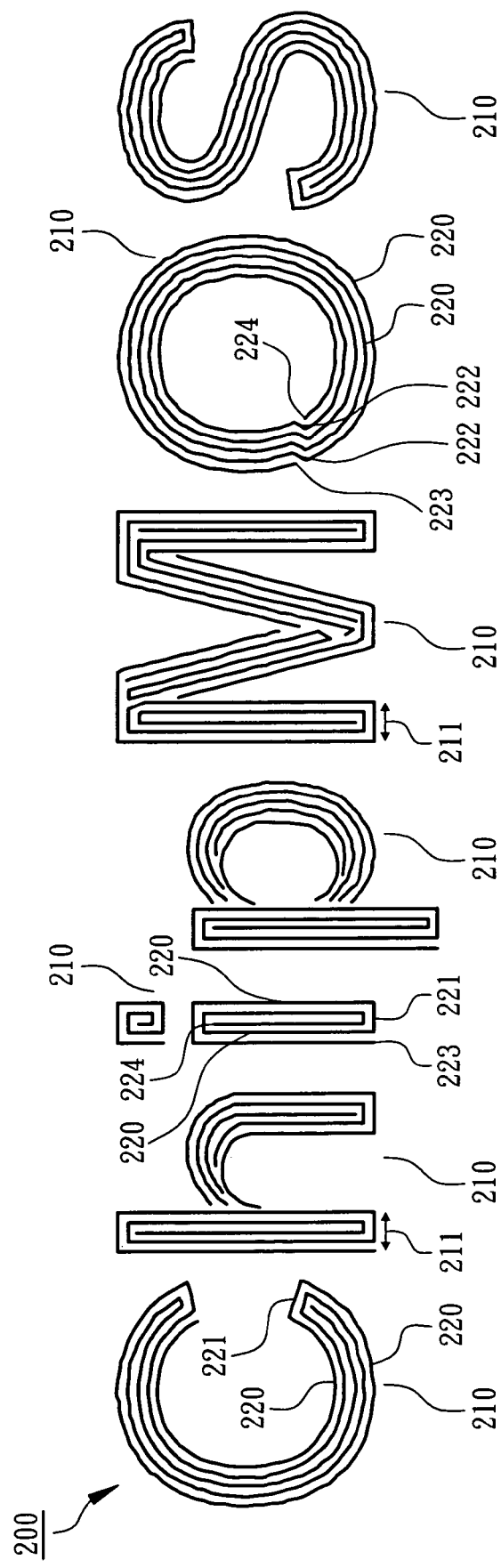
FIG. 2 shows a laser mark on an IC component according to the embodiment of the present invention.
Figure 3:
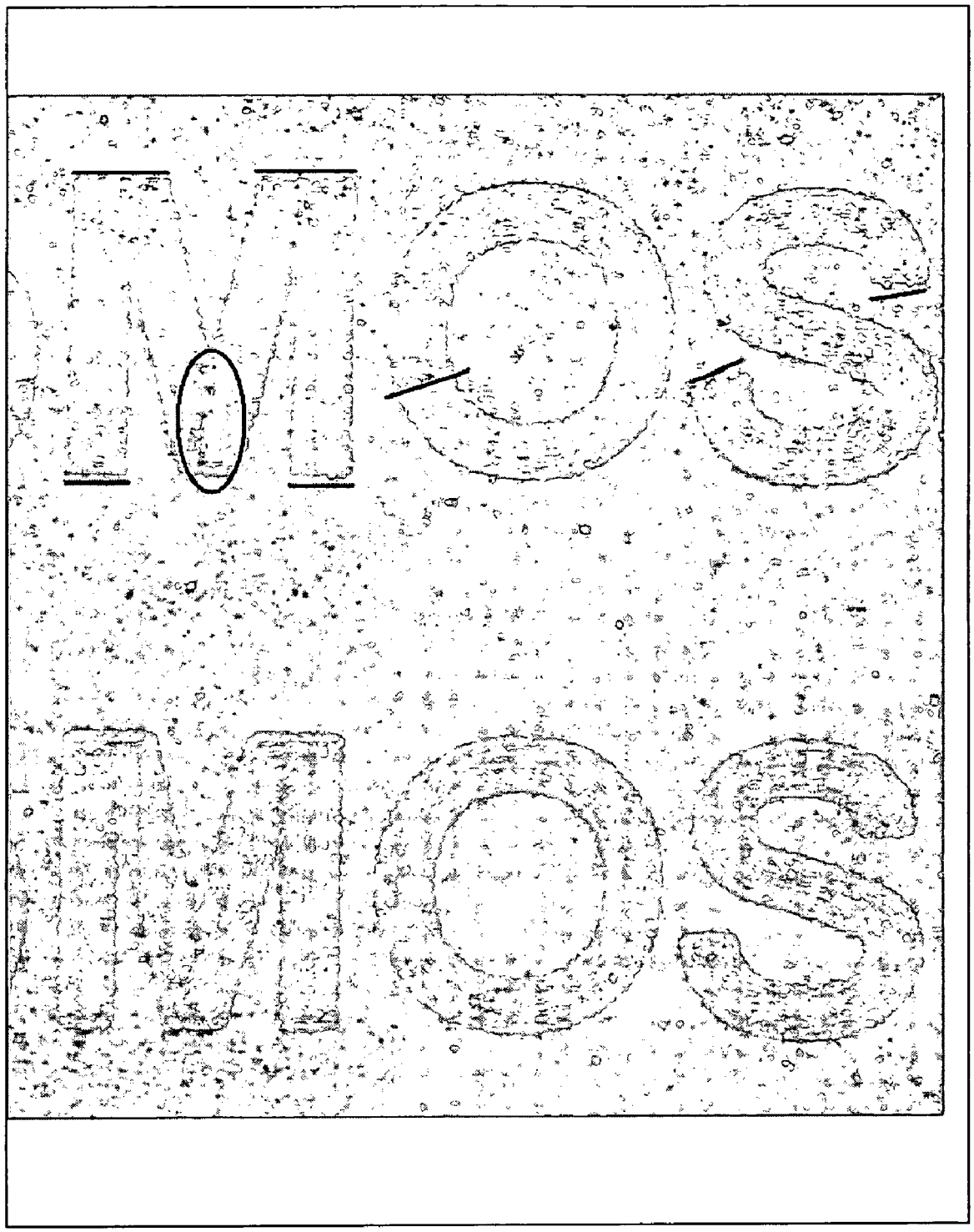
FIG. 3 is the photograph comparison between the conventional laser mark and the laser mark according to the embodiment of the present invention.

Please refer to FIG. 2. A laser mark 200 is fabricated in an IC component, includes a plurality of characters 210 formed in one surface of an IC component, the surface may be backside of a wafer, backside or active surface of a chip, or on the top surface of an IC package, etc. The characters 210 are created by a low-power laser beam with the wave length between 200 nm and 850 nm, such as 532 nm green laser. In this embodiment, the characters 210 include "C", "h", "i", "p", "M", "O", "S" as a trademark. Each character 210 has at least a character stroke, for example, "C", "O", or "S" character has one character stroke, "h" or "p" character has two character strokes, etc. Each character stroke width 211 is greater than the widths of the laser paths 220 in a same character stroke. Moreover, at least two of the laser paths 220 in a same character stroke are integrally connected as a laser-inscribing stroke, so that end-to-end breaks between the laser paths 220 can be reduced. During one time of on/off the laser beam, the laser-inscribing stroke is created and has an external endpoint 223 and an internal endpoint 224 to achieve a better character profile. It will eliminate the discontinuity and broken lines at the connection of the laser paths 220. Preferably, the internal endpoint 224 orients toward the connection of the laser paths 220 to become secrete. As shown in bottom photograph in FIG. 3, the laser mark 200 in this embodiment only has a little of end-to-end breaks. When comparing to the conventional laser mark 100 in the upper photograph in FIG. 3, the laser mark 200 looks more perfect and complete without obvious discontinuity and broken lines.

Please refer to FIG. 2. Some of the characters 210 are unclosed, such as "C", "h", "i", "p", "M", "S", the connected laser paths 220 in the unclosed characters are connected with a U-shaped connection 221 or a curve within a same character stroke. As shown in FIG. 2, the U-shaped connection 221 connect two laser paths 220 inscribed in parallel and moving in opposite directions as a laser-inscribing stroke so that the integrality of the characters can be enhanced. The other of the characters 210 are closed characters having one character stroke, such as "0" in numbers or "O" in English characters, at least two of the parallel laser paths 220 moving in a same direction are integrally connected as a laser-inscribing stroke, wherein the connection between the laser paths 220 are oblique lines 222. The laser-inscribing stroke has an external endpoint 223 and an internal endpoint 224, preferably, the internal endpoint 224 orients toward one of the oblique lines 222. Accordingly, all of the laser paths 220 can be designed by CAD (Computer Aided Design) such as AutoCAD to create better laser-inscribing paths having integral laser paths to constitute various character strokes. The on/off times of laser beam also can be reduced to save energy and prolong working life of laser beam machine. Moreover, the efficiency of laser marking can be increased.

The above description of embodiments of this invention is intended to be illustrative and not limiting. Other embodiments of this invention will be obvious to those skilled in the art in view of the above disclosure.

What is claimed is:

1. An IC component having a laser mark including a character, the character having at least a character stroke consisting of a plurality of laser paths inscribed on a surface of the IC component by a laser beam, wherein the width of the character stroke is greater than the widths of the laser paths, wherein at least two of the plurality of laser paths are integrally connected as a laser-inscribing stroke to reduce end-to-end breaks between the laser paths, wherein the laser-inscribing stroke has only two independent terminals which are separated by at least one of the laser paths without crossing of the laser paths.

2. The IC component of claim 1, wherein the laser-inscribing stroke has an internal endpoint toward the connection of the laser paths.

3. The IC component of claim 1, wherein the connected laser paths from the same laser-inscribing stroke are parallel and in opposite moving directions.

4. The IC component of claim 3, wherein the connected laser paths are integrally connected with a U-shaped connection or a curve.

5. The IC component of claim 3, wherein the character stroke is unclosed.

6. The IC component of claim 1, wherein the connected laser paths from the same laser-inscribing stroke are parallel and in the same moving direction.

7. The IC component of claim 6, wherein the connected laser paths are integrally connected with an oblique line.

8. The IC component of claim 6, wherein the character is closed.

9. The IC component of claim 8, wherein the character is "O" or "0".

10. The IC component of claim 8, wherein the closed character has only one character stroke.

11. The IC component of claim 1, wherein the surface is a backside of a chip.

* * * * *

UNITED STATES PATENT AND TRADEMARK OFFICE
CERTIFICATE OF CORRECTION

PATENT NO. : 7,622,806 B2  Page 1 of 1
APPLICATION NO. : 11/249465
DATED : November 24, 2009
INVENTOR(S) : Su et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1054 days.

Signed and Sealed this

Twenty-sixth Day of October, 2010

David J. Kappos
*Director of the United States Patent and Trademark Office*